US008003881B2

(12) United States Patent
Berson et al.

(10) Patent No.: US 8,003,881 B2
(45) Date of Patent: Aug. 23, 2011

(54) POLYMERIC NANOFIBRIL NETWORK FOR PHOTOVOLTAIC CELLS

(75) Inventors: Solenn Berson, Strasbourg (FR); Remi De Bettignies, Saint Julien en Genevois (FR); Muriel Firon, Egly (FR); Stephane Guillerez, Lepin le Lac (FR)

(73) Assignee: Commissariat a l'Energie Atomique, Paris (FR)

( * ) Notice: Subject to any disclaimer, the term of this patent is extended or adjusted under 35 U.S.C. 154(b) by 373 days.

(21) Appl. No.: 12/083,960

(22) PCT Filed: Oct. 20, 2006

(86) PCT No.: PCT/FR2006/002366
§ 371 (c)(1),
(2), (4) Date: Sep. 23, 2008

(87) PCT Pub. No.: WO2007/048909
PCT Pub. Date: May 3, 2007

(65) Prior Publication Data
US 2009/0120491 A1    May 14, 2009

(30) Foreign Application Priority Data
Oct. 25, 2005    (FR) .................................... 05 10894

(51) Int. Cl.
*H01L 31/00* (2006.01)

(52) U.S. Cl. ......... 136/243; 528/377; 528/373; 528/380

(58) Field of Classification Search .................. 528/373, 528/380, 377; 136/243, 256, 255; 252/501; 438/82
See application file for complete search history.

(56) References Cited

U.S. PATENT DOCUMENTS

| 2004/0227097 A1* | 11/2004 | Brabec et al. ............ 250/370.12 |
| 2005/0022856 A1* | 2/2005 | Komatsu et al. ............... 136/243 |
| 2005/0131139 A1* | 6/2005 | Kaner et al. ................... 524/800 |

FOREIGN PATENT DOCUMENTS

| AT | 411 305 B | 11/2003 |
| WO | WO 01/86734 A1 | 11/2001 |
| WO | WO 2004/004023 A2 | 1/2004 |

OTHER PUBLICATIONS

Frisbie et al., J. Phys. Chem. B, 2003, 108, 2674-2680.*
Jeffrey A. Merlo et al., "Field Effect Transport and Trapping in Regioregular Polythiophene Nanofibers," J. Phys. Chem. B 2004, 108, 19169-19179.
S. Malik, et al., "CdS embedded poly(3-hexyl thiophene) nanowire: Synthesis and characterization," Journal of Materials Science Letters, 22, 2003, 1113-1115.
Bozhang Yu et al., Morphology and photoluminescent properties of poly(p-phenylene) nanofibre arrays fabricated by template method, Materials Science and Engineering A325 (2002) 215-220.
A.C. Arias et al., "Vertically segregated polymer-blend photovoltaic thin-film structures through surface-mediated solution processing," Applied Physics Letters, vol. 80, No. 10, Mar. 11, 2002 pp. 1695-1697 XP 012030246.

* cited by examiner

*Primary Examiner* — Randy Gulakowski
*Assistant Examiner* — Shane Fang
(74) *Attorney, Agent, or Firm* — McKenna Long & Aldridge LLP

(57) ABSTRACT

A method of preparing a polymeric composition with photovoltaic properties comprises a step of blending, in a solvent, at least one electron donor type semiconductor polymeric material essentially in the form of nanofibrils and at least one electron acceptor type material in the solvent, said nanofibrils representing at least 10% by weight of the electron donor type semiconductor polymeric material, to polymeric compositions with photovoltaic properties, and to photovoltaic cells incorporating such polymeric compositions.

28 Claims, 9 Drawing Sheets

POLYMERIC NANOFIBRIL NETWORK FOR PHOTOVOLTAIC CELLS

This application claims the benefit of the filing date of French Patent Application No. 05 10894 filed on Oct. 25, 2005 in the French Intellectual Property Office and International Application PCT/FR2006/002366 filed Oct. 20, 2006, both of which are incorporated in their entirety herein by reference.

FIELD OF INVENTION

The present invention relates to a novel polymeric composition with photovoltaic properties, to a method of its preparation, and to its use in photovoltaic cells.

BACKGROUND OF THE INVENTION

The term "polymeric composition with photovoltaic properties" means any composition comprising at least one polymeric material that is capable of directly converting light energy, in particular from solar radiation, into positive and negative electrical charges or bound electron-hole pairs, and of ensuring their dissociation and their transport in order to generate a photocurrent.

The principle of direct conversion of solar energy into electrical energy was discovered by Becquerel in 1839 and the first silicon-based solar cells saw the light of day in the mid-1950s. Currently, photovoltaic cells are essentially composed of inorganic semiconductor materials such as gallium arsenide or crystalline silicon. The conversion efficiencies of the best inorganic photovoltaic cells that are currently commercially available are typically of the order of 10% to 15%. Even though the maximum theoretical efficiency of a silicon monojunction cell, which is close to 30%, means that improvements in performance can be aspired to, the high cost associated with the fabrication of cells of that type remains an impediment to their large-scale market penetration.

In this regard, semiconductor polymers and organic molecules offer an interesting alternative because of their low production costs and of processing techniques that are inaccessible to inorganic materials. Organic and polymeric molecules are easy to handle and selecting them as a base material means that only one technology is required in order to engineer the cell (i.e. from the substrate to the protective capsule). Further, polymers are degradable, which ensures technology that is clean in the longterm.

Since the publication in 1986 by Tang (C. W. Tang: Two-layer organic photovoltaic solar cell. Appl. Phys. Lett., 48, 183, 1986; U.S. Pat. No. 4,164,431) which discloses a bilayer heterojunction with a power conversion efficiency of close to 1%, huge strides have been taken in work in the organic materials field.

Another advance occurred with the discovery of effective charge transfer between C60 and a semiconductor polymer, MEH-PPV, by Sariciftci et al in 1992 (N. S. Sariciftci, L. Smilowitz, A. J. Heeger, F. Wudl, Science, 258, 1474, 1992), and then the production of the first MEH-PP V/C60 bilayer heterojunction cell in 1993 par Saricitftci et al. (Appl. Phys. Lett., 62, 585, 1993).

In 1995, the first bulk heterojunctions were produced from solutions containing the donor and acceptor (G. Yu, A. J. Heeger, J. Appl. Phys., 78, 4510, 1995; J. J. M. Halls, C. A. Walsh, N. C. Greenham, E. A. Marseglia, R. H. Friend, S. C. Moratti, A. B. Holmes, Nature, 376, 498, 1995). In those cells, the interface between the p-type semiconductor and the n-type semiconductor is distributed throughout the volume of the active layer, which produces good charge separation from photo-generated excitons that have mobility that is very low in organic materials. This concept of interpenetrating networks between two compounds, respectively the electron donor and electron acceptor, has been widely applied, and a wide variety of chemical structures, from molecular species to polymers, has been explored.

Exciton dissociation is improved when photogeneration sites are bulk or heterojunction distributed. Such a configuration is obtained by organizing the donor/acceptor type materials in interpenetrated networks, which increases the surface area of the junction.

Apart from the fact that the mobilities of holes and of electrons in donor and acceptor materials must be as high as possible, the organization of the materials into interpenetrating networks facilitates charge conduction towards the electrodes. As a general rule, charge transport improves as molecular order increases.

The challenge, then, is to organize those donor and acceptor materials into interpenetrating networks in order to optimize the dissociation surface area of excitons and to encourage charge conduction without the appearance of recombination phenomena. Recombination phenomena limit conduction and collection of charge at the electrodes of the photovoltaic devices.

Currently, the most promising photovoltaic cells combine fullerenes and electron donor type polymers in interpenetrating networks. As an example, photovoltaic cells with an active layer formed by an association of a soluble conjugated electron donor type polymer, poly-(3-hexylthiophene) (P3HT) and a soluble electron acceptor type buckminsterfullerene derivative (PCBM) have conversion efficiencies that approach 5%. Their efficiency is not only due to the intrinsic properties of the materials, but also to the molecular order and the spatial organization of the active layer. P3HT organizes itself into a matrix of nanocrystalline structures that provide good hole conduction properties. The second material, PCBM, which is a C60 derivative, is integrated with the matrix and provides good electron conduction.

Recently, Yang et al have shown that the molecular order of active layers comprising a blend of P3HT/PCBM is dependent on the fabrication conditions (X. Yang, et al, Nanoletters, 5, 579, 2005). P3HT/PCBM active layers actually have a different architecture depending on whether the P3HT/PCBM blend has or has not undergone annealing after deposition onto a substrate. After annealing, the mixture becomes heterogeneous, with zones rich in PCBM and zones rich in polymer in which the polymer chains form fibrillar structures. In contrast, short fibrillar structures, which are not connected together, appear in the absence of annealing. Yang et al established the paradigm that an annealing step is essential to producing an organization that can produce photovoltaic cells presenting high efficiency. In fact, annealing can control the shape and organization of the chains of polymers into nanofibrils, thereby creating an interpenetrating network with the acceptor material.

The term "annealing" means a heat treatment comprising heating to, and holding at, an appropriate temperature followed by slow cooling, resulting in a structural constitution that is close to equilibrium.

However, some of the substrates used as donor/acceptor thin layer supports in photovoltaic cells cannot tolerate the temperatures employed during annealing.

SUMMARY OF THE INVENTION

Surprisingly, the inventors have shown that it is possible to obtain structures organized into interpenetrating networks directly from depositing a blend of electron donor/acceptor type materials onto a substrate without having recourse to annealing.

The inventors have developed a method that can provide a large quantity of nanofibrils in solution, which allows them to be deposited directly onto a substrate to form a film of electron donor type semiconductor polymeric material organized into a three-dimensional network of nanofibrils of sufficient thickness and length. This particular organization of electron donor type polymeric material is beneficial for the electron transport properties of the nanofibrils. Other materials that are soluble or dispersible in the solution of nanofibrils may be added in order to produce films comprising a mixture of at least two materials. Such materials that are soluble or dispersible in the solution of nanofibrils may in particular be electron acceptor type materials when the conjugated polymeric material is an electron donor in its excited state, or electron donor type materials when the conjugated polymer is an electron acceptor in its excited state. The films produced from such solutions of nanofibrils have a structure that includes entangled nanofibrils. Such films are advantageously employed in opto-electronic and electronic applications and they are particularly suitable for photovoltaic conversion. It is particularly important that this structure of nanofibrils in a three-dimensional network is obtained directly from the deposition procedure without resorting to annealing.

Thus, the present invention provides a method of preparing a polymeric composition with photovoltaic properties, comprising a step of blending, in a solvent, at least one electron donor type semiconductor polymeric material essentially in the form of nanofibrils and at least one electron acceptor type material in the solvent, said nanofibrils representing at least 10% by weight of the electron donor type semiconductor polymeric material.

The term "electron donor type semiconductor polymeric material" means any material comprising at least one polymer that is capable of generating excitons after absorbing photons and of giving up electrons to an electron acceptor type material. It may optionally be doped with p type impurities.

The term "nanofibrils" means nanostructures, in solution or in the solid state, that are cylindrical in shape, formed by chains of polymers connected together via strong interactions. Typically, the diameter of these structures is in the range 1 nm [nanometers] to 20 nm and their length is over 100 nm, generally over 500 nm and typically in the range 500 nm to 5 mm.

In a preferred implementation of the method of the invention, the electron donor type semiconductor polymeric material of the polymeric composition is selected from polythiophenes, polythienylenevinylenes, polyphenylenes, polyphenylenevinylenes, polyanilines, polyfluorenes, and a blend thereof. Preferably, the electron acceptor type semiconductor polymeric material is selected from poly(3-hexylthiophene), poly(3-hexyloxythiophene), (poly(2-methoxy-5-(2'-ethylhexyloxy)p-phenylenevinylene), and poly(2-methoxy-5-(3',7'-dimethyloctyloxy)-1,4-phenylenevinylene), derivatives thereof, and a blend thereof.

The term "electron acceptor type material" means any material comprising at least one organic and/or inorganic acceptor capable of transporting electrons. It may optionally contain n-type impurities.

In a preferred implementation of the invention, the electron acceptor type material of the polymeric composition comprises inorganic acceptor type semiconductor nanocrystals that may optionally be coated with an organic layer, semiconductor nanofibers, organic acceptors, or a mixture thereof.

Preferably, the inorganic acceptor type semiconductor nanocrystals are coated with an organic layer comprising polythiophenes, oligothiophenes, or a blend thereof. The semiconductor nanocrystals and nanofibers are selected from Si, AsGa, Ge, InP, CdSe, and CdTe, and a mixture thereof. The organic acceptors are selected from C60 fullerene derivatives, C61 fullerene derivatives, C70 fullerene derivatives, carbon nanotubes and their derivatives, perylene and its derivatives, quinoxalines and tetracyanoquinodimethane, and a mixture thereof.

In accordance with a particularly preferred implementation of the invention, the electron acceptor type material is organic. More preferably, the organic electron donor acceptor type material is 1-(3-methoxycarbonyl)-propyl-1-phenyl-[6,6]-C61.

The term "derivative" means any organic compound, such as compounds substituted in various manners but having the same basic structure as the family from which they derive. Particular examples of substituents are alkyl, alkoxy, or aryl radicals. The term "alkyl radical" means any group of 1 to 20 carbon atoms, possibly mono- or poly-substituted, linear, branched or cyclic, saturated or unsaturated, said radical possibly containing one or more heteroatoms such as N, O, Si, S, P or a halogen such as fluorine. Non-limiting examples of "alkyl radicals" that may be mentioned are the methyl, ethyl, propyl, isopropyl, butyl, sec-butyl, tert-butyl, pentyl, hexyl, octyl, decyl, dodecyl, methoxyethyl, methoxypropyl, methoxybutyl, methoxypentyl, methoxyhexyl, methoxyoctyl, ethoxyethyl, ethoxypropyl, ethoxybutyl, ethoxypentyl, ethoxyhexyl, ethoxyoctyl, propoxymethyl, propoxyethyl, and propoxypropyl radicals. The term "aryl radical" means any aromatic or heteroaromatic carbonaceous structure, which may optionally be substituted, constituted by one or more aromatic or heteroaromatic cycles, each comprising 3 to 6 atoms. The term "alkoxy radical" means any structure of 1 to 20 carbon atoms having an oxygen atom in the 1-position substituted by an alkyl chain as defined above. Non-limiting examples of "alkoxy radicals" that may be mentioned are the methoxy, ethoxy, propoxy, butoxy, pentyloxy, hexyloxy, octyloxy, decyloxy, dodecyloxy, methoxyethoxy, methoxypropoxy, methoxybutoxy, methoxypentyloxy, methoxyhexyloxy, methoxyoctyloxy, ethoxyethoxy, ethoxypropoxy, and ethoxybutyloxy radicals.

Particular non-limiting examples of alkyl and aryl radical substituents that may be mentioned are halogens, alkyl groups, alkoxy groups, haloalkyl groups, substituted or unsubstituted aryl groups, substituted or unsubstituted heteroaryl groups, amino, cyano, azido, hydroxy, mercapto, keto, carboxy, ethoxy, and methoxy groups.

The substituents are advantageously selected depending on the specific chemical and electronic properties which the skilled person would like to obtain for the polymeric composition. As an example, the presence of aliphatic chains significantly increases the solubility of the chemical compounds in aprotic apolar organic solvents. Delocalization of electrons in the chemical compounds may be optimized by selecting the appropriate substituent using theoretical calculations that determine specific chemical potentials or electron energy level values. Modeling acceptor and donor type materials allows the energies of the highest occupied and lowest unoccupied molecular orbitals to be predicted in order to optimize the formation of excitons, which excitons are necessary for the photovoltaic cell to function, and to produce the desired organic polymeric compound, using a DFT computer program such as Gaussian 98®, for example.

Advantageously, the blend obtained at the end of the blending step is deposited onto a substrate directly without resorting to annealing.

Preferably, the blending step is carried out without stirring.

In accordance with a preferred implementation of the invention, the nanofibrils of the blend represent 25% to 93% by weight of the electron donor type semiconductor polymeric material.

In accordance with a preferred implementation, the nanofibrils are prepared before the blending step of the method of the invention during a step of dissolving at least one electron donor type semiconductor polymeric material in a solvent encouraging the production of nanofibrils.

Preferably, the dissolution step is carried out by dissolution in a solvent at a temperature above ambient temperature followed by slow cooling to ambient temperature. Typically, the solvent is organic and selected from p-xylene, cyclohexanone, chlorobenzene, dichlorobenzene, and a mixture thereof. In a particularly preferred implementation, the solvent is p-xylene.

It is possible to control cooling of the solution comprising at least one electron donor type semiconductor polymeric material in an organic solvent in order to allow the chains of polymers to associate into fibrillar structures. The association phenomenon may be relatively slow and nanofibril formation may require several days. However, nanofibril formation may be partial and a fraction of unassociated polymeric material may subsist at the end of the nanofibril formation step.

Nanofibril formation may be monitored and/or controlled using any optical procedure that is suitable for the polymeric material. Preferably, the skilled person can envisage a procedure allowing an appraisal of the appearance of lower energy absorption bands that are characteristic of a solution of nanofibrils, and that do not appear in a solution of unassociated polymeric material. UV-visible spectrophotometry enables such a determination to be performed.

The term "unassociated polymeric material" means any material comprising at least one polymer, in which the polymer-polymer interaction in solution can be ignored compared with the polymer-solvent interaction. The term "amorphous polymeric material" means any material comprising at least one polymer that does not have polymer chains in the form of nanofibrils as defined in the present application, i.e. not associated together in the solid state. Typically, this phase is obtained from an unassociated polymeric material by evaporation of the solvent.

In accordance with a particularly preferred implementation of the invention, P3HT nanofibrils are prepared by dissolving P3HT in cyclohexanone. The solution obtained is heated to a temperature of about 150° C. and then cooled slowly to ambient temperature. When the P3HT is dissolved in p-xylene, the solution is heated to a temperature of about 70° C. then cooled to ambient temperature. The rate of cooling is selected to be in the range 10° C. per hour ($h^{-1}$) and 100° $C.h^{-1}$, preferably in the range 20° $C.h^{-1}$ to 25° $C.h^{-1}$. It is also possible to cool in successive constant temperature stages.

During preparation of the nanofibrils, partial precipitation of the polymeric material can occur during cooling. In order to obtain a homogeneous solution, it is thus advantageous to eliminate this precipitate occurring during cooling by filtering at least once before reaching ambient temperature. The term "homogeneous solution" means a solution without an apparent precipitate and that is stable with time (Example 1). As an example, when the solvent is cyclohexanone, the solution of polymeric material is preferably filtered when its temperature is about 50° C. Filtration is then carried out on a filter of porosity that is suitably adapted. Preferably, the nanofibrils are prepared in a manner that is protected from light and in an inert atmosphere (for example nitrogen or argon) during preparation.

In accordance with another preferred implementation of the invention, the nanofibrils are separated from the unassociated fraction of the electron donor type polymeric material by centrifuging and/or filtering. The nanofibrils obtained thereby may optionally be dried and isolated in the form of a powder. Dissolving these nanofibrils at ambient temperature in a compatible solvent such as p-xylene generally results in a homogeneous solution. The phenomenon of polymer chain disassociation appears to be limited in p-xylene. Further, the proportion of nanofibrils may reach 75% to 93% by weight of the total electron donor type semiconductor polymeric material. In order to obtain solutions with different concentrations of nanofibrils, the solution obtained may optionally be diluted in the same organic solvent. It is also possible to add to this solution, in the same organic solvent, a solution of the same unassociated polymeric material comprising short polymer chains derived from the soluble fraction of the commercially available polymer (FIG. 4). This step of separation of nanofibrils allows the commercially available polymer to be purified or fractionated.

The present invention also provides a polymeric composition with photovoltaic properties obtained by the method of the invention. Advantageously, the electron donor type semiconductor polymeric material of the polymeric composition with photovoltaic properties is poly-(3-hexylthiophene) and the electron acceptor type material is 1-(3-methoxycarbonyl)-propyl-1-phenyl-[6,6]-C61. Preferably, the polymeric composition of the invention contains 0.5% to 2% by weight of electron donor type semiconductor polymeric material.

The present invention also provides a method of depositing a material comprising the polymeric composition of the invention, in the form of a thin layer, the material being deposited, in a monolayer or a multilayer, onto a solid substrate by immersion, using inkjet, spin-coating, spray drying, spreading or printing techniques. Preferably, the solid substrate is selected from glasses, conductive polymers, polymers coated with a conductive oxide, and glasses coated with a conductive layer. Preferred conductive polymers are polyethylenedioxythiophene (PEDOT), polyaniline, or a mixture thereof.

In accordance with a preferred implementation, a layer of conjugated organic polymers may be deposited between the thin layer and the substrate. This deposition can smooth the surface of the substrate and/or increase the work function of the electrode. Advantageously, the organic conjugated polymers are selected from poly(aniline) in the conductive state, PEDOT doped with polystyrene sulphonate (PSS) and a mixture thereof. The thickness of the layer of conjugated organic polymers is generally in the range 10 nm to 150 nm, preferably 80 nm.

Finally, the present invention provides a bulk heterojunction-type photovoltaic cell comprising at least two electrodes that are electrically interconnected by the polymeric composition of the invention, or by the thin layer of the invention. Advantageously, the composition is selected so that the power conversion efficiency of the photovoltaic cell is 3% or more. The electrodes may be independently conductive or semiconductive. Typically, a conductive electrode comprises a metallic surface of metals such as gold, calcium, aluminum, silver, magnesium, chromium, lithium, or metal alloys. It may also comprise a stack of metallic layers and/or a conductive oxide such as $InSn_2O_3$. It may optionally be coated with a conductive polymer such as polypyrrole, polythiophenes including Baytron® type PEDOT/PSS (poly(3,4-ethylenedioxythiophene/polystyrenesulfonate), polyanilines, or derivatives thereof. Typically, a semiconductor electrode comprises silicon, AsGa, Ge, SiC. The semiconductor electrode may optionally be deposited on an insulating material such as silica, alumina or glass. Advantageously, at least one of the electrodes is transparent.

In a preferred implementation, a photovoltaic cell in accordance with the invention may be prepared on a transparent substrate (71) from a material that may be flexible or rigid, for example glass, on which a conductive layer (72) is deposited, constituted by a metal oxide such as indium tin oxide (ITO). The film of ITO (72) may be etched, for example over a third of the surface. The sample is then cleaned, advantageously with ultrasound in different solutions, preferably acetone, then isopropanol. Next, it is rinsed with deionized water and dried, for example in an oven. Contacts (73), preferably chromium-gold contacts, may then be deposited under vacuum to allow the I(V) characteristics of the cell to be measured. A UV-ozone treatment is then generally applied to the ITO substrate. A pre-layer (74) which may be poly(aniline) in the conductive state or PEDOT (poly(ethylenedioxythiophene)) doped with PSS (polystyrene sulfonate) is deposited on this substrate. The thin layer comprises a composition comprising an electron donor type semiconductor polymeric material and an electron acceptor type material, preferably PCBM; it is deposited from the liquid directly onto the pre-layer described above. The electrode is constituted by a film (76), generally LiF, with a thickness of 0.5 nm to 5 nm, preferably 1 nm, deposited under vacuum, for example, onto the thin layer (75), and a metallic layer, for example aluminum, advantageously deposited under vacuum and in a thickness of 5 nm to 200 nm, preferably 100 nm, thereby covering the LiF film. An illuminated surface (76), which is generally circular with a diameter of 6 mm, is defined on this layer, which is formed from Al, for example. The photovoltaic cell is generally in the shape of a rectangle, for example with a width of 17 mm and a length of 25 mm.

By means of the fibrillar structure and the association of the polymeric chains, the polymeric composition of the invention forms a heterojunction between the two materials of the composition. Two networks, which ideally are continuous, are thus created either side of this heterojunction.

The method of preparing the polymeric composition can create a three-dimensional semiconductor network without the need for annealing. This method represents a decisive advance in the fields of electronics and opto-electronics, particularly in the field of organic solar cells, because of its simplicity of implementation and control of the morphology of the layers obtained. This technique can produce a mixture of two different nanostructures in solution, for example and advantageously for the production of photovoltaic cells a mixture of nanofibrils of P3HT and of PCBM in any proportion. Using the usual techniques of solution deposition, this allows the production in a single step of a layer with morphology and thickness that are controlled.

MORE DETAILED DESCRIPTION

The present invention can be better understood from the following examples; these examples are given solely by way of an illustration of the subject matter of the invention; they do not in any way constitute a limitation.

EXAMPLES

Preparation of Nanofibrils

Example 1

P3HT in Cyclohexanone 5 milligrams (mg) of P3HT was dissolved in 10 grams (g) of cyclohexanone heated to 150° C. with stirring. During the dissolution procedure, the solution was protected from light and ambient air to prevent chemical oxidation and/or photo-oxidation of the polymer. After complete dissolution of the polymer (obtaining a clear solution), the solution was cooled slowly to 50° C. Various cooling rates in the range 10° C.h$^{-1}$ to 100° C.h$^{-1}$ were tested and no notable influence was observed on the morphology of the nanofibrils. Typically, a cooling rate in the range 20° C.h$^{-1}$ to 25° C.h$^{-1}$ was employed. At 50° C., the solution was filtered through a porous membrane (for example a Teflon® membrane filter with a porosity of 0.45 μm [micrometer]) to eliminate the precipitate which started to form from 70° C. The formation procedure for the nanofibrils was continued by cooling the filtrate at the same rate to ambient temperature.

Example 2

P3HT in p-xylene 0.2 g of poly-(3-hexylthiophene) was dissolved in 10 g of p-xylene heated to 70° C. with stirring. During the dissolution procedure, the solution was protected from light and ambient air to prevent chemical oxidation and/or photo-oxidation of the polymer. The solution obtained was clear; it was cooled to ambient temperature at a rate of 20° $C.h^{-1}$. Changes in this solution, monitored by UV-visible spectrophotometry, show that the formation of nanofibrils is a slow method at this temperature (25° C.). After two days at 25° C., the UV-visible spectrum (FIG. 1) no longer changed notably and the solution formed a gel of viscosity that reduced substantially on stirring (manual or mechanical). This gel remained stable; no precipitation was observed, even after storing for 4 weeks at ambient temperature protected from light and air.

Figure 4:
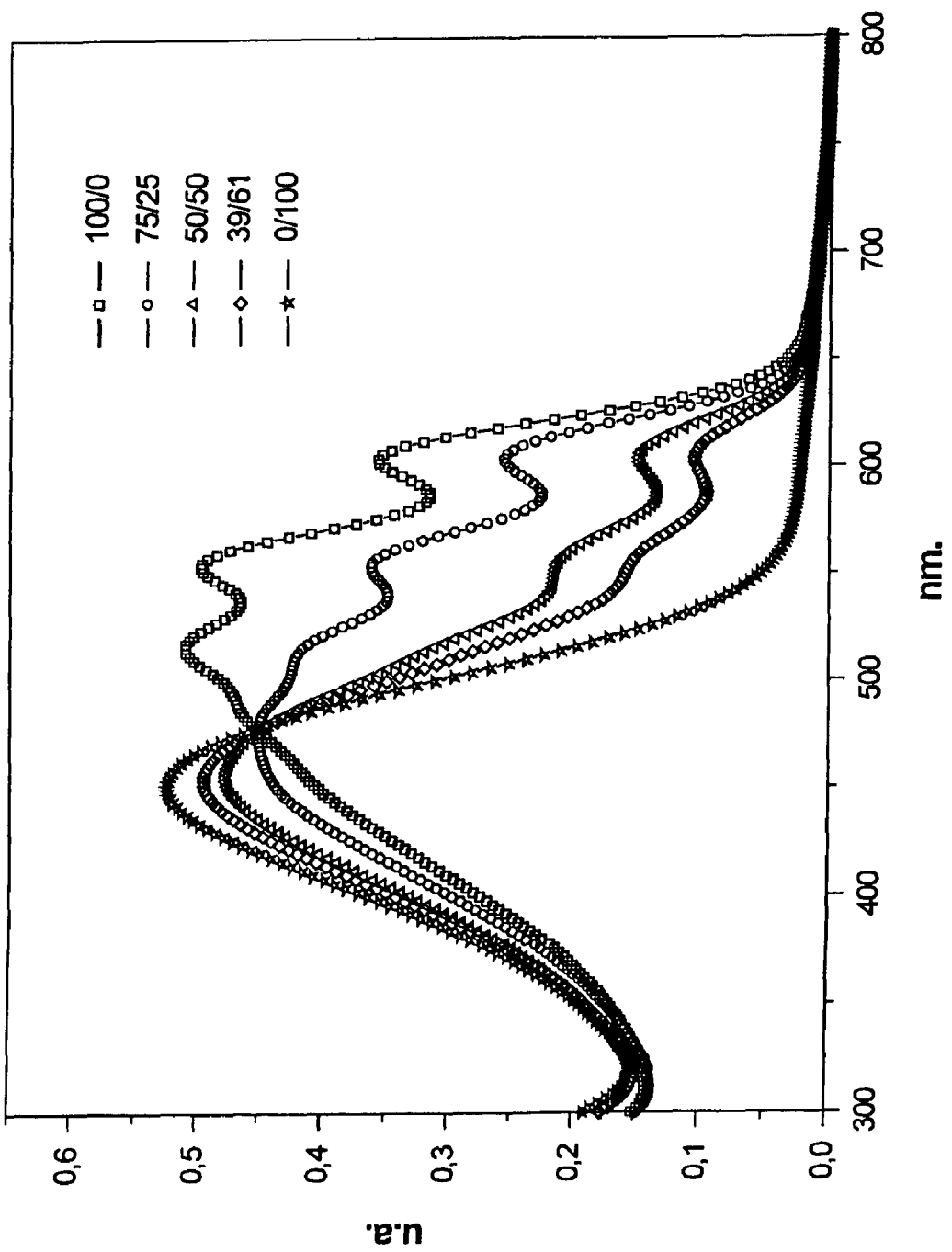
FIG. 4 shows the absorption spectrum of solutions having ratios of unassociated polymeric material nanofibrils of 100/0, 75/25, 50/50, 39/61, and 0/100.

This solution could then be centrifuged at 5000 rpm [revolutions per minute] for 2-3 hours, or filtered and then washed with a minimum of p-xylene through a porous membrane (porosity 0.2 µm) to separate the nanofibrils from the unassociated polymeric material. The nanofibrils were then recovered and taken up into solution in p-xylene. The spectrum of the solution obtained shows that the major portion of the unassociated polymeric material had been eliminated (FIG. 4). These purified nanofibrils could then be used as is or as a mixture with a predetermined quantity of unassociated polymeric material.

In these solvents, in contrast to chlorobenzene or dichlorobenzene (currently used to produce the best photovoltaic cells), the polymer nanofibrils formed spontaneously. These objects have lengths of >1 µm and a diameter of about 10 nm to 30 nm.

Characterization of Nanofibrils on Substrates

In order to determine the spectral characteristics of the nanofibrils more accurately with a view to an application in the photovoltaic field, and to determine their stability, deposits of nanofibrils were produced.

Example 3

Deposition onto Silicon Coated with Native Oxide

A wafer of silicon coated with native oxide was immersed in the solution of 0.05% by weight P3HT nanofibrils in p-xylene or cyclohexanone for a period in the range 10 seconds to 10 minutes, then the excess solution was eliminated in a stream of argon.

Example 4

Spin-Coating Deposition onto Various Substrates 0.5% by weight of P3HT nanofibrils in p-xylene were deposited by spin-coating onto a silicon wafer using the following deposition conditions: 1000 rpm for 40 seconds then 2000 rpm for 60 seconds with an acceleration of 200 rpm.

0.5% by weight of P3HT nanofibrils in p-xylene were deposited by spin-coating on glass using the deposition conditions of Example 3. These films were of the order of 30-40 nm thick.

1% by weight of P3HT nanofibrils in p-xylene was deposited by spin-coating onto glass using the same deposition conditions; the thicknesses obtained were of the order of 80 to 110 nm.

Example 5

Multiple Spin-Coating Deposits onto Various Substrates

Successive deposits of nanofibrils were produced as follows: a first layer was deposited from a 0.5% by weight solution of nanofibrils in p-xylene under the conditions of Example 4, then the next layer was deposited from the same solution immediately following the end of spin-coating rotation and without additional drying of the subjacent layer. This procedure was repeated as many times as was necessary so as to increase the thickness of the deposit to the desired value. Depositions of polymer alone made onto glass had a thickness that increased from 30 nm for a single deposited layer to 70 nm for two layers. The absorbance (A) increased as a function of the number of layers deposited: the maximum $A_{max\ (555nm)}$=0.45 arbitrary units (a.u.) for one layer, 0.85 for 2 layers and 1.95 for 4 layers.

Figure 1:
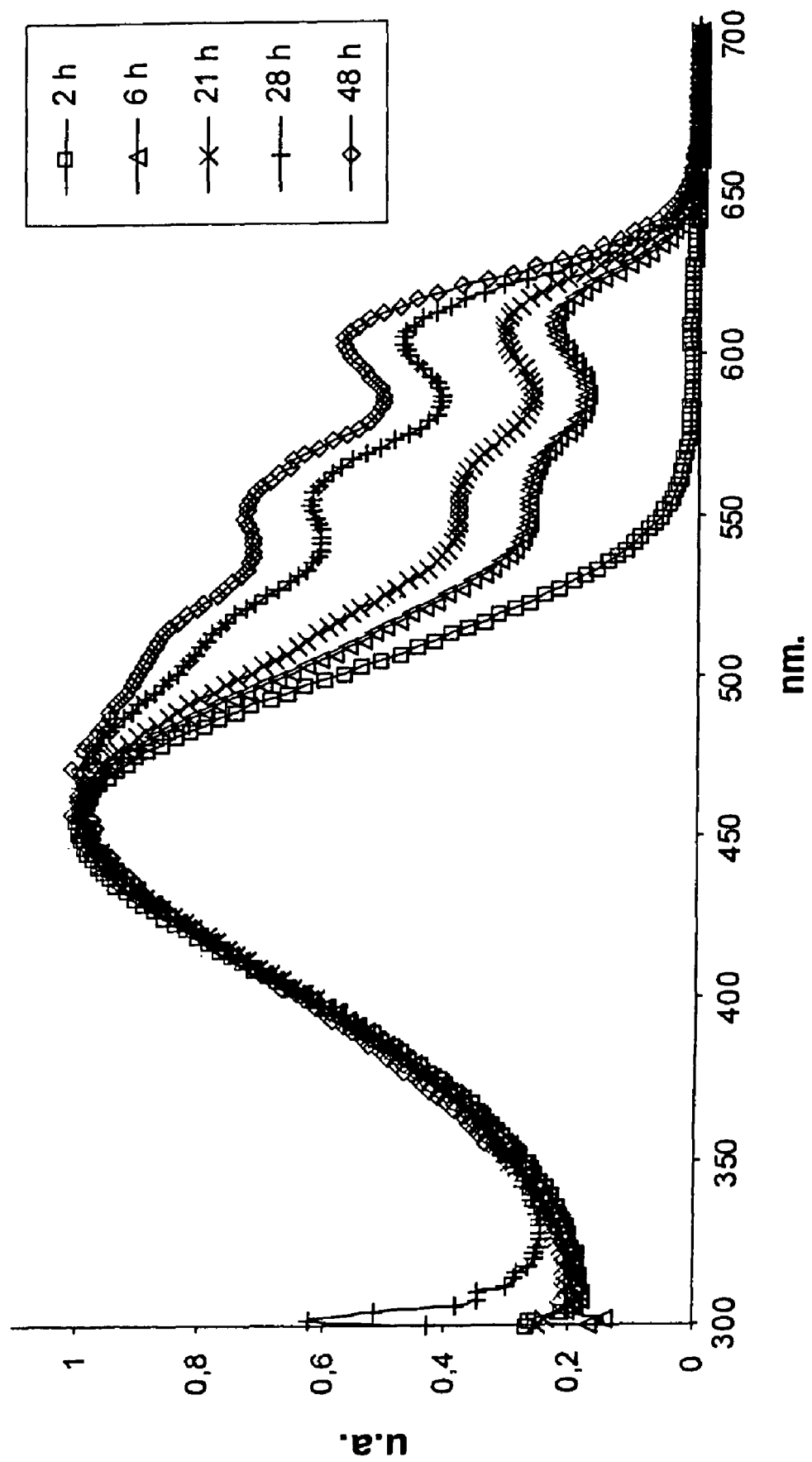
FIG. 1 shows the change in the absorption of a 1% solution of P3HT at 25° C. in p-xylene 2, 6, 21, 28, and 48 hours after cooling.

The formation of nanofibrils in solution was indicated by the emergence of several absorption bands shifted towards lower energies relative to the initial peak (band attributed to unassociated polymer chains and indicated by an arrow) (FIG. 1). The deposits made onto a transparent substrate (glass) were characterized by a set of three absorption bands and an absorption threshold located at about 650 nm (1.9 electronvolts (eV)) (FIG. 1).

For P3HT, these absorption bands are located at about 525 nm, 560 nm and 610 nm. The solutions of nanofibrils have an electronic absorption spectrum characterized by the appearance of lower energy bands than for the chains of polymer in solution in p-xylene which have an absorption maximum at about 450 nm.

Figure 2:
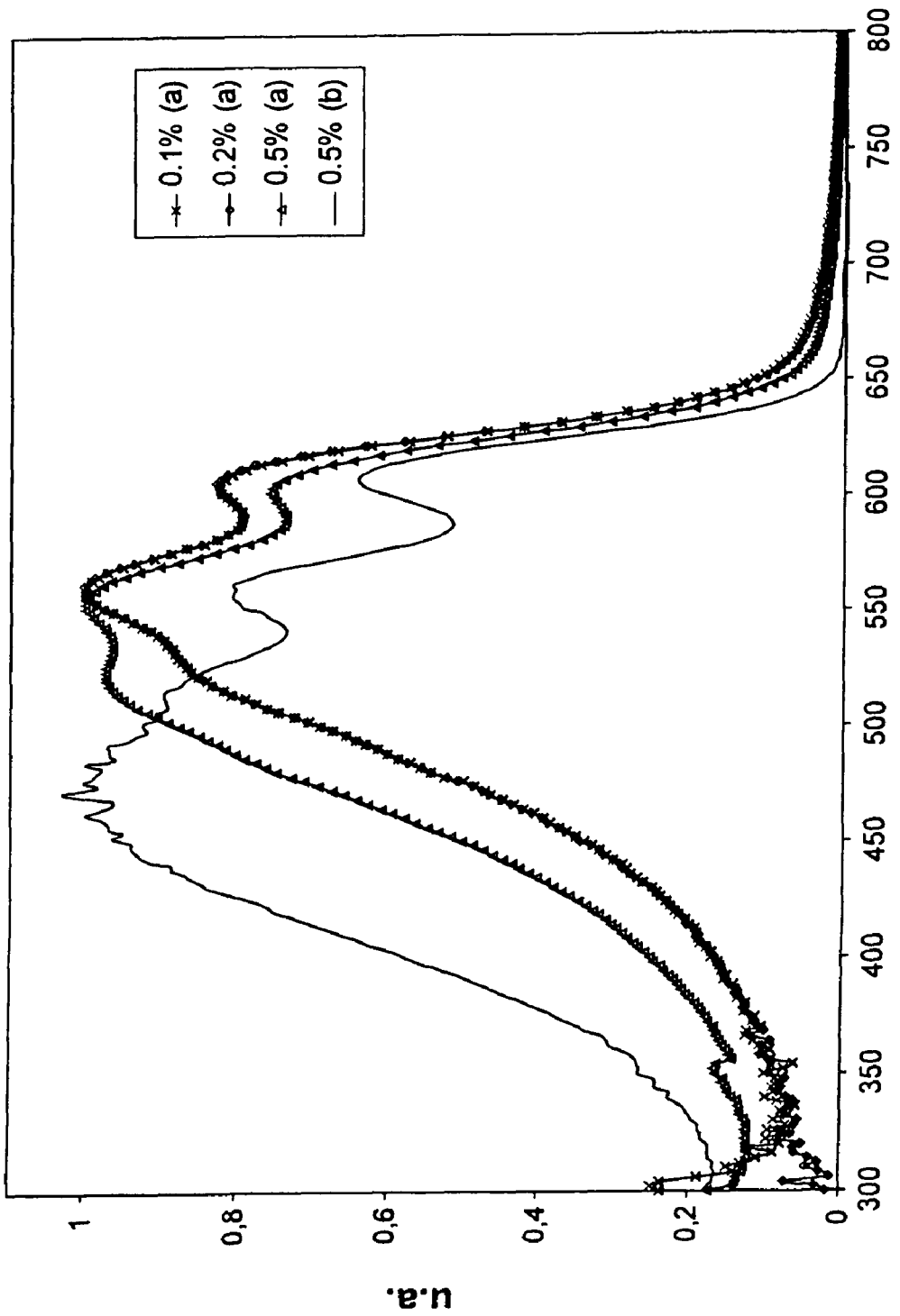
FIG. 2 shows absorption spectra of a thin layer prepared from 0.5%, 0.2% and 0.1% by weight solutions of P3HT in p-xylene deposited directly onto a glass support (a), and of a solution prepared from 0.5% by weight solutions of P3HT in p-xylene (b).
Figure 3:
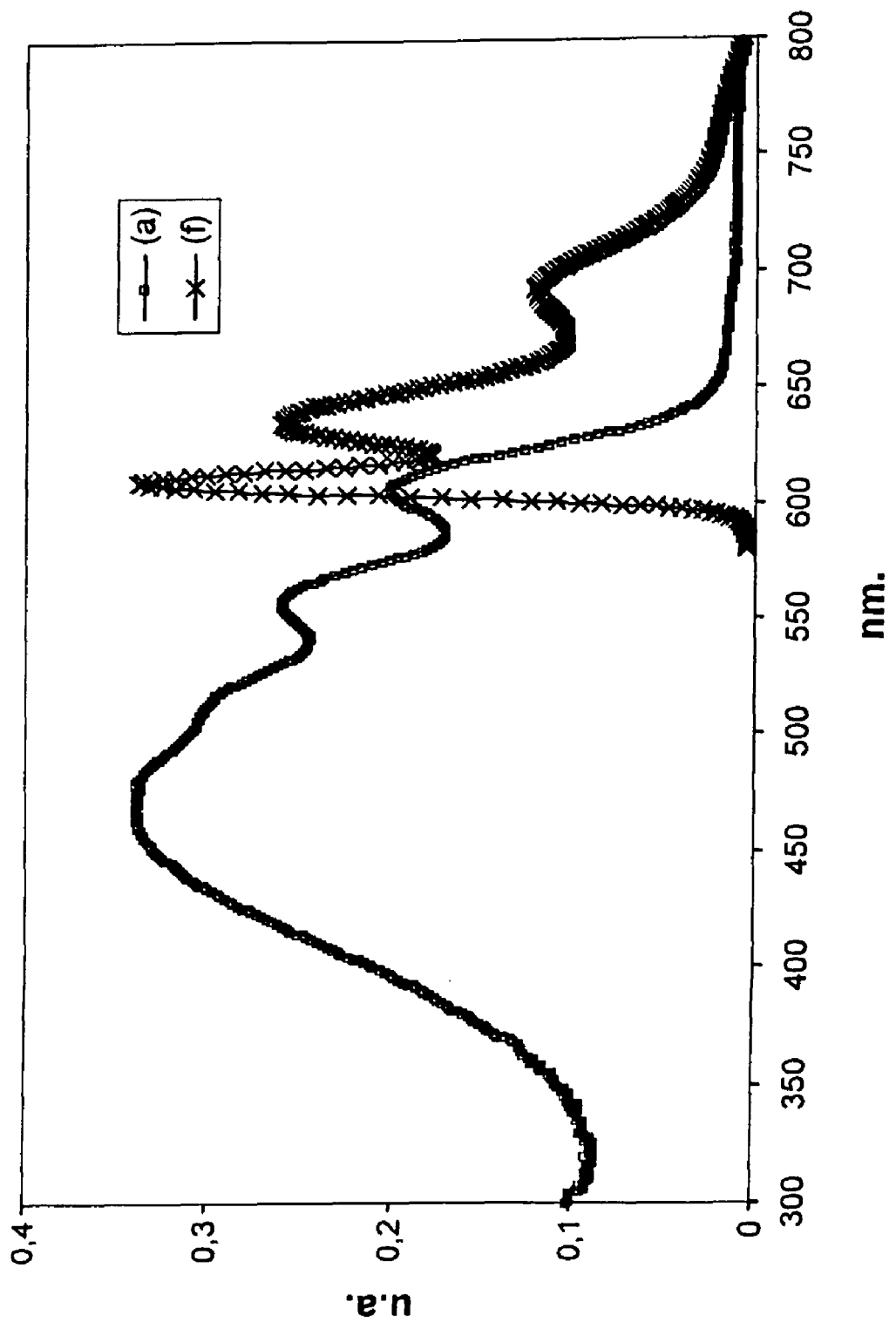
FIG. 3 shows the absorption spectrum of a solution prepared from 0.5% solutions of P3HT in p-xylene (a) and its fluorescence spectrum at an excitation of 610 nm (f).

The solutions of P3HT nanofibrils in cyclohexanone and p-xylene as well as the solid deposits were characterized by UV-visible absorption spectroscopy (FIG. 2) and by fluorescence (FIG. 3).

The solid or solution absorption spectra have a fine structure which is characteristic of good inter-organization of the polymer chains. Its characteristics mean that using this type of compound in a photovoltaic device allows effective transport of excitons towards the charge dissociation sites then good transport of holes towards the anode.

It should be noted that passage from the solution to the solid state is accompanied by a shift to higher wavelengths (FIG. 2).

Enrichment of Solution in Amorphous Polymer

Example 6

Solution of Nanofibrils and Amorphous Polymer

Solutions of nanofibrils and unassociated polymer chains were obtained by simply mixing a 1% solution of P3HT nanofibrils in p-xylene and a 1% solution of unassociated P3HT polymer chains (portion soluble in dichloromethane) in p-xylene.

The changes in the absorption spectra in solution show that the two forms of the polymers are miscible in all proportions (FIG. 4). As a result, layers deposited from this type of solution may contain variable and completely adjustable proportions of nanofibrils and amorphous polymer.

Composition

Example 7

Preparation of a Composition of P3HT/PCBM Nanofibrils

Figure 5:
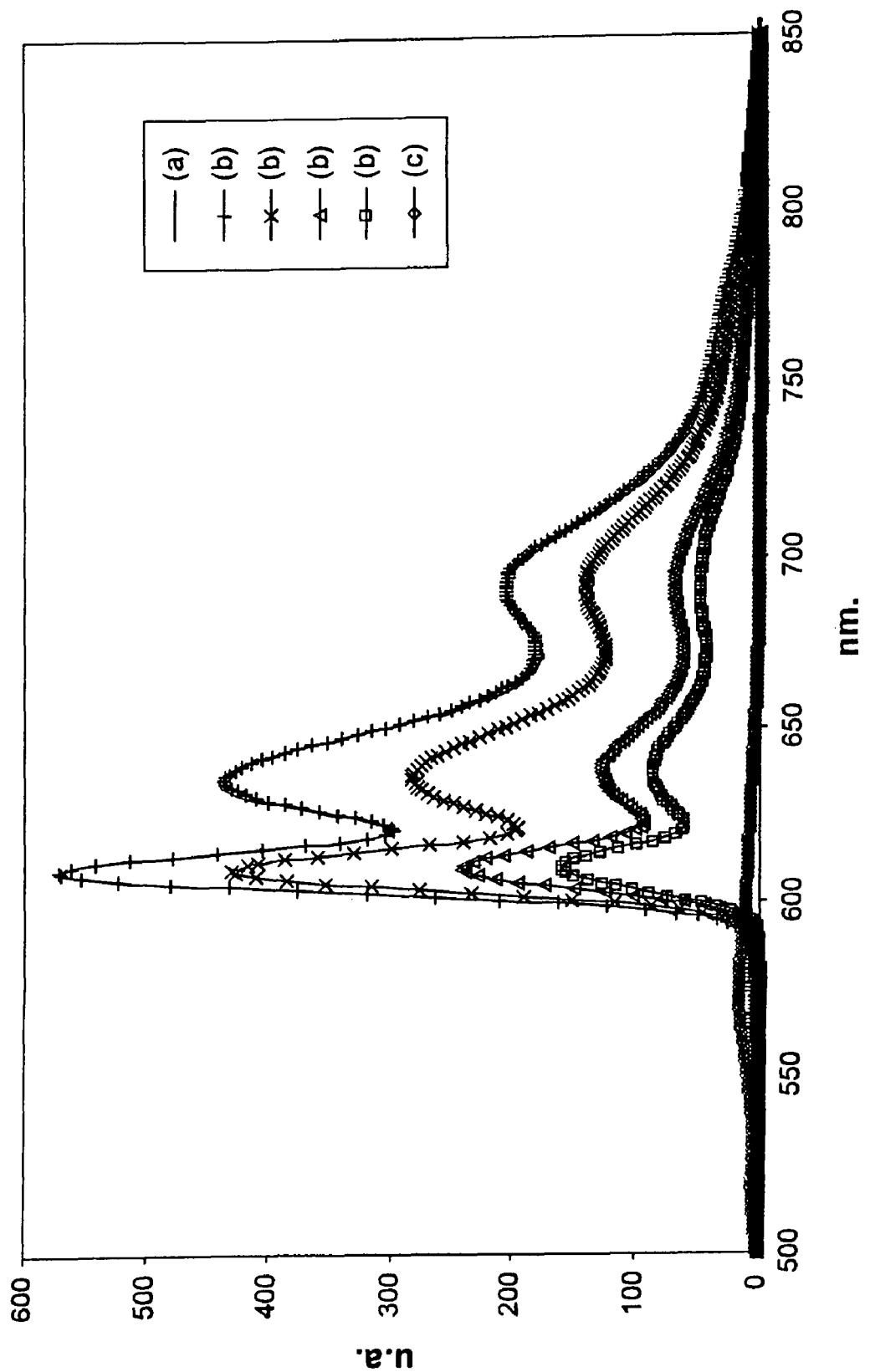
FIG. 5 shows the fluorescence emission spectra of compositions of P3HT alone (a), P3HT+PCBM (b) and PCBM alone (c) in p-xylene.

PCBM, an electron acceptor type compound, was added in the solid form to a 1% by weight solution of P3HT nanofibrils in p-xylene. The P3HT/PCBM ratio was 1:1. The blend was stirred to produce a homogeneous solution. FIG. 5 shows the various fluorescence spectra in p-xylene of (PCBM/P3HT) compositions in accordance with the invention or of PCBM and P3HT. A gradual quenching can be observed that is a function of the increasing amount of PCBM, which results in charge transfer from P3HT to PCBM.

Figure 6:
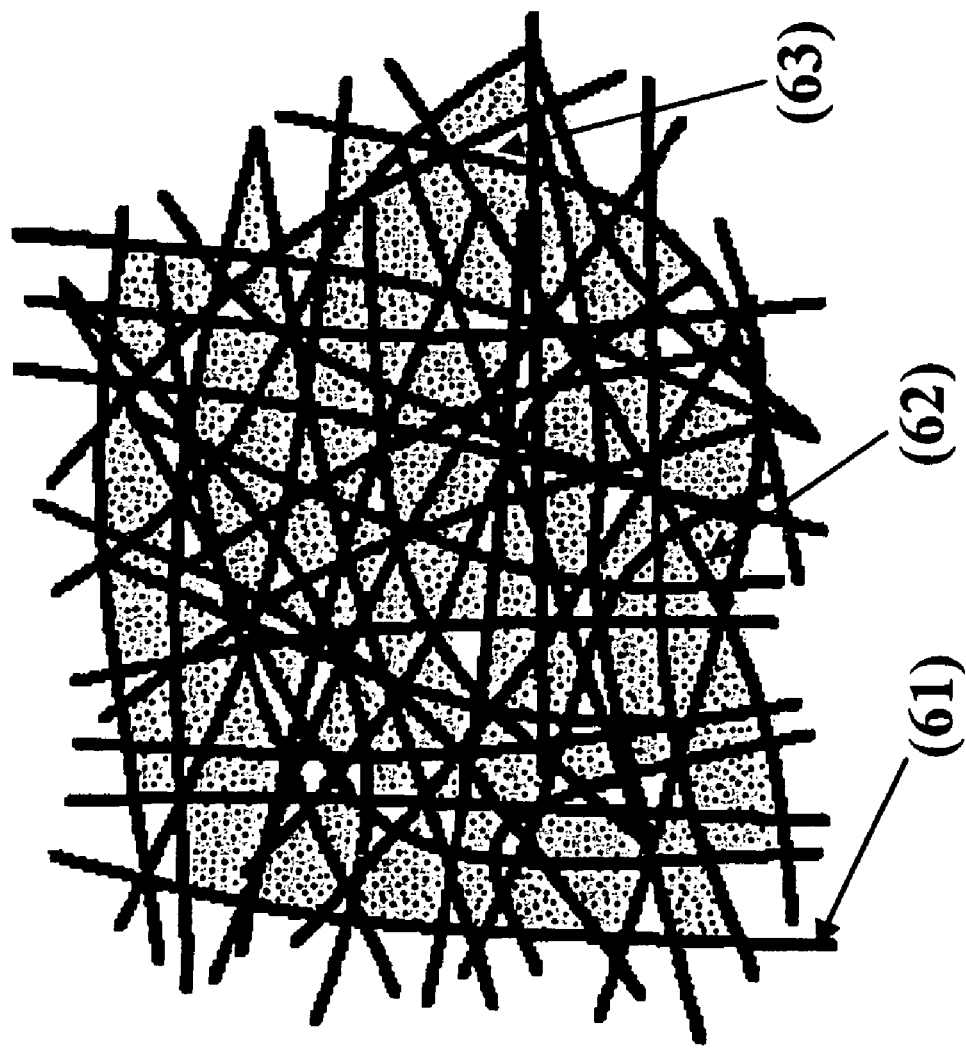
FIG. 6 is a diagrammatic two dimensional representation of a composition of the invention, the continuous lines representing the electron donor type polymer nanofibrils (61), in gray the space occupied by the electron acceptor type materials (62) and in white the vacant spaces (63).

The composition obtained was homogeneous and stable at ambient temperature; its structure is shown diagrammatically in FIG. 6.

Figure 8:
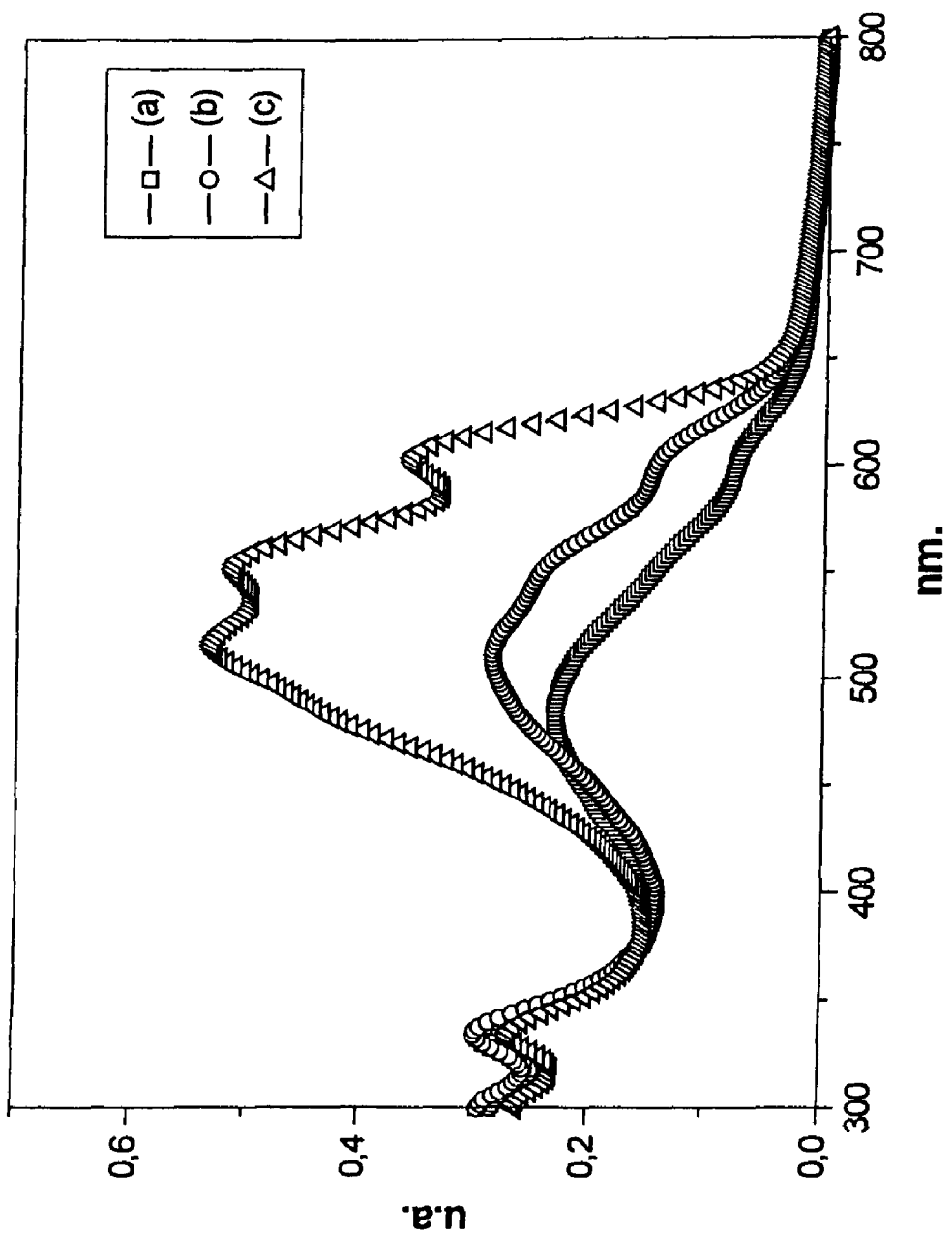
FIG. 8 shows the absorption spectrum of a 1:1 P3HT:PCBM thin layer deposited on a glass support obtained from a 1% solution of unassociated P3HT in chlorobenzene (a), this same thin layer annealed at 100° C. for 30 minutes (b), and a thin layer obtained from a solution containing nanofibrils of P3HT in p-xylene (c).

This solution was deposited by spin-coating onto a glass plate at about 1000 rpm over 40 seconds then 2000 rpm for 60 seconds with an acceleration of 200 rpm. FIG. 8 shows the various absorption spectra of films obtained from P3HT:PCBM solutions (1% by weight of P3HT) in a ratio of 1:1. It should be noted that the spectrum obtained from a solution containing nanofibrils and PCBM, (c), has a fine structure which is characteristic of good inter-organization of the polymer chains in the presence of PCBM. By comparison, the absorption spectrum obtained from a solution of unassociated polymer chains of P3HT and PCBM is offset towards short wavelengths and does not exhibit a fine structure (a). It was then necessary to anneal these films to allow the polymer chains to organize themselves in the presence of PCBM (b).

Example 8

Preparation of a Composition of P3HT Nanofibrils/PCBM

PCBM, an electron acceptor type compound, was added in the solid form to a 1% by weight solution of unassociated polymer chains of P3HT in p-xylene. The P3HT:PCBM ratio was 1:1. The solution was heated to 70° C. with stirring. During the dissolution procedure, the solution was protected from light and ambient air to prevent chemical oxidation and/or photo-oxidation of the polymer. The clear solution obtained was cooled to ambient temperature at a rate of 20° $C.h^{-1}$; passage from the orange color to the blue color observed was characteristic of the appearance of nanofibrils. Once a solution that was stable with time had been obtained, the blend could be stirred to produce a homogeneous solution with 75% by weight of nanofibrils relative to the total amount of polymer.

Example 9

Preparation of a P3HT/PCBM Composition

A 2% by weight solution of PCBM in p-xylene was added to a 2% by weight solution of P3HT nanofibrils in p-xylene. The P3HT:PCBM ratio was 1:1 and the final concentration was 1% by weight of P3HT in p-xylene. The blend was stirred to produce a homogeneous solution.

Photovoltaic Device

Example 10

Preparation of a Photovoltaic Cell

Figure 7:
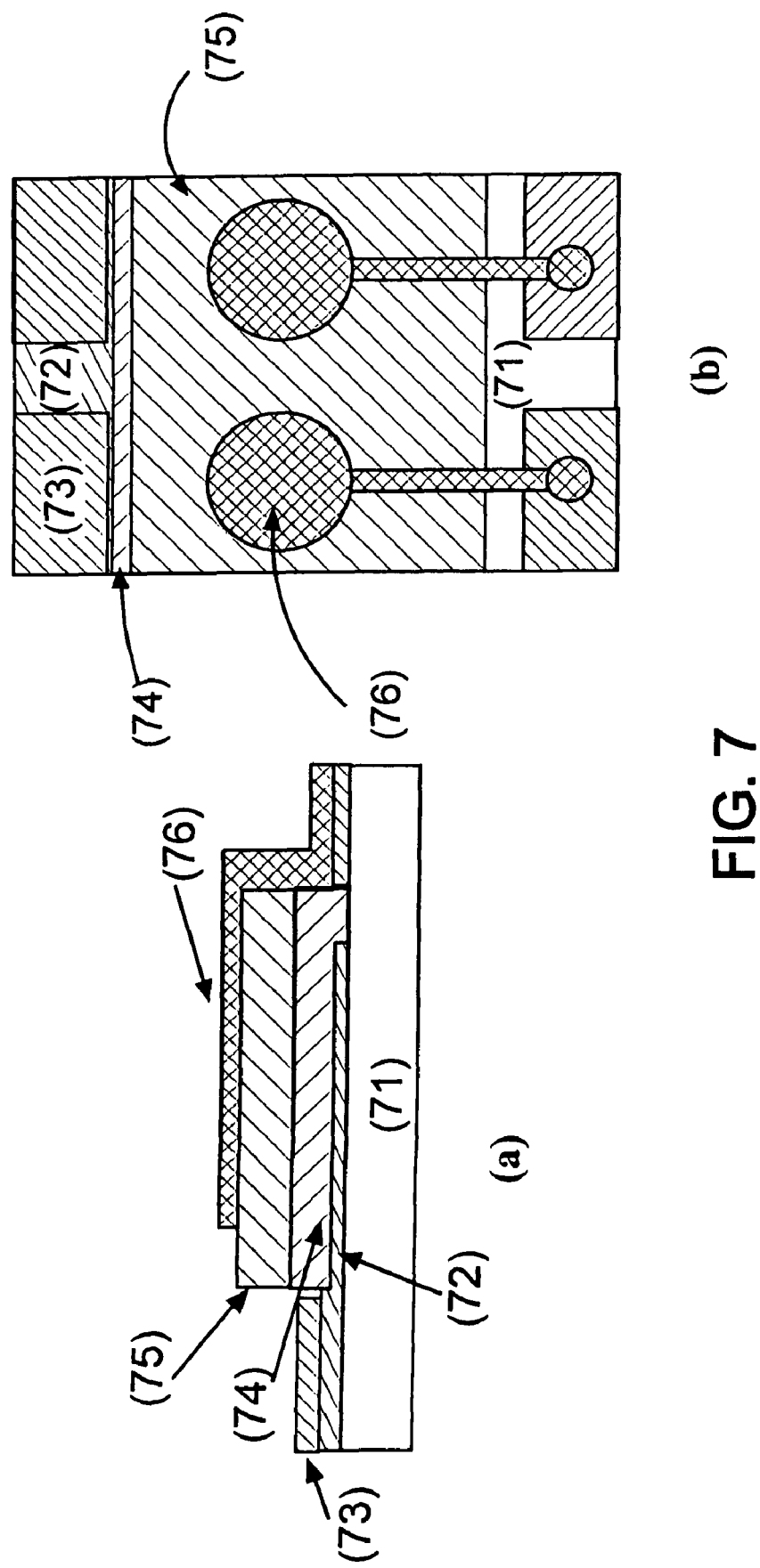
FIG. 7 is a diagrammatic sectional (a) and top (b) view of a photovoltaic cell having a thin layer (5) incorporating the compositions of the invention.

A photovoltaic cell used for the tests had the configuration shown in FIG. 7. It comprised a glass substrate coated with a layer of ITO which was itself coated with a layer of PEDOT:PSS (conductive polymer sold by Bayer). The upper layer of PEDOT:PSS was coated with a film (nanofibrils and PCBM) of the invention. Finally, the film or active layer was coated, in succession, with a layer of LiF and a layer of aluminum. The configuration of the cell was thus as follows:

Glass substrate/ITO/PEDOT:PSS/nanofibrils+PCBM/LiF/Al

The cell was prepared as follows:

The surface area of the substrates was 4.25 $cm^2$. The conditions for deposition by centrifugal coating (spin-coating) were as follows:

In the first step, the coating period was 40 seconds at 1500 rpm with an acceleration which enabled 1500 rpm to be reached in 4 seconds, then in the second step the coating period was 40 seconds at 2000 rpm, with an acceleration over 4 seconds to change from 1500 rpm to 2000 rpm.

Step 1: A layer of PEDOT:PSS (product sold by Bayer) was deposited by spin-coating. The thickness of the layer obtained was about 80 nm; deposition was carried out in air followed by oven drying under vacuum.

Step 2: The active layer was deposited under nitrogen using a glove box. The active surface area was 3 $cm^2$. It was prepared by spin-coating a composition of P3HT/PCBM with a percentage of nanofibrils of 75% by weight relative to the total polymeric material in a P3HT:PCBM ratio of 1:1, in p-xylene, in a P3HT concentration of 1% by weight of solution, onto a glass plate at about 1000 rpm for 40 seconds then 2000 rpm for 60 seconds with an acceleration of 200 rpm.

Step 3: A layer of LiF (about 1 nm) was vacuum deposited, then a layer of aluminum (100 nm) was also vacuum deposited. The surface area was about 0.3 $cm^2$.

Figure 9:
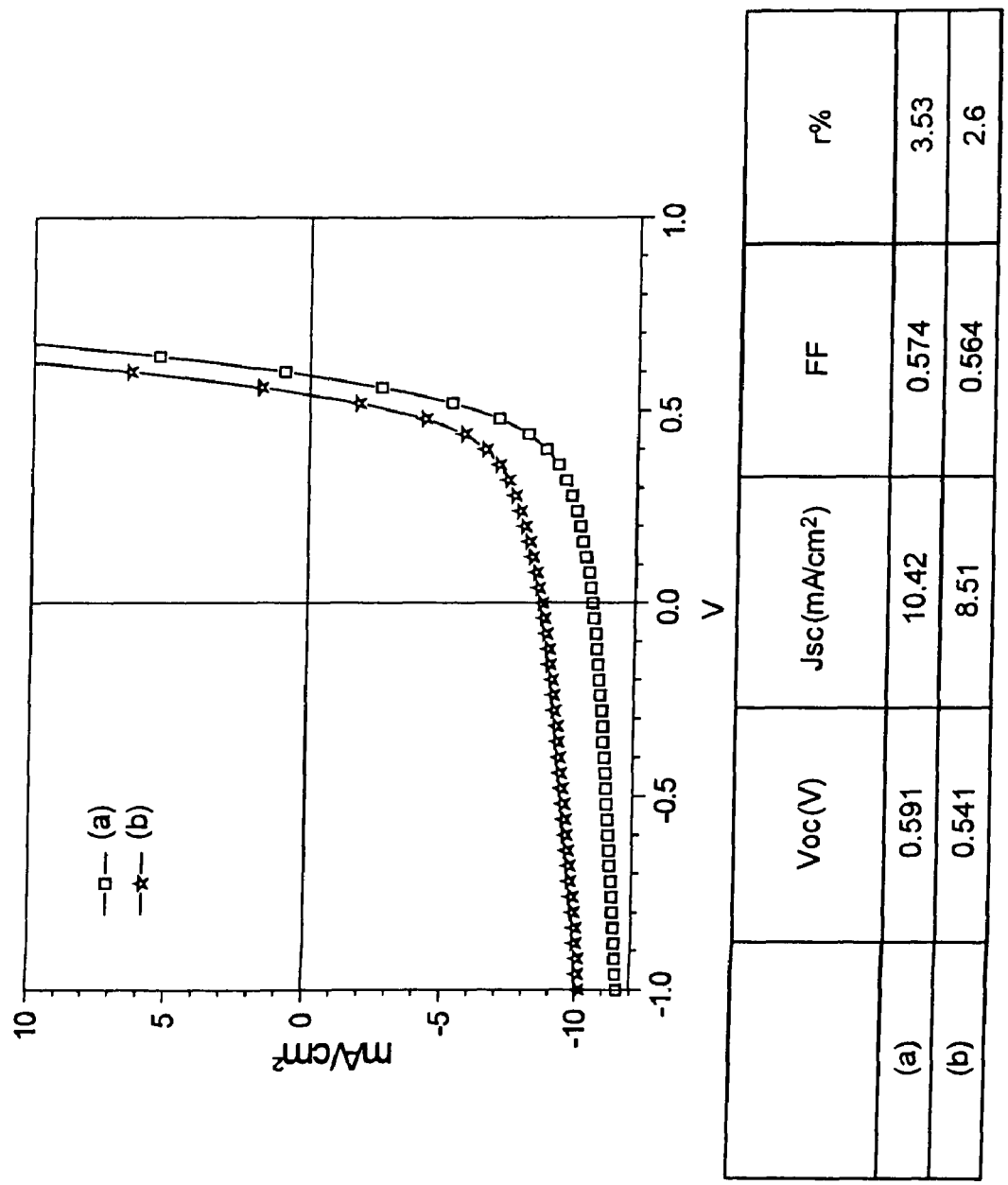
FIG. 9 shows the current density Jsc in mA/cm$^2$ [milli-amps/square centimeter] as a function of the tension applied to the terminals of a photovoltaic cell having a thin layer that has been obtained from a solution with a proportion of 75% nanofibrils relative to the total mass of polymeric material with a P3HT:PCBM ratio of 1:1. Curve (a) corresponds to a measurement carried out on the cell as obtained; curve (b) corresponds to a measurement carried out on the same cell after annealing at 100° C. for 30 minutes. In this figure, Jsc in mA/cm$^2$ corresponds to the short circuit current density, Voc in V [volt] corresponds to the open circuit voltage; FF corresponds to the fill factor which characterizes the rectifying nature of the diode. Ideally, FF=1.

The prepared cell of the invention was then characterized using a glove box under a controlled atmosphere, i.e. a nitrogen atmosphere with an oxygen content and water vapor content of less than 1 ppm at ambient temperature. The current-voltage (I(V)) characteristics were recorded under AM1.5 illumination at a power density of 1000 $W/m^2$. The table in FIG. 9 includes the characteristics of the cells with an active layer of the invention. The efficiency shown corresponds to the degree of conversion of photons into electrons.

The performances shown in the table demonstrate the non utility and probable degradation of cells in which the composition of the active layer was prepared by annealing. Using an annealing step reduces the efficiency by close to 1%, which corresponds to a loss of about ¼ of its efficiency in absolute terms.

The invention claimed is:

1. A method of preparing a polymeric composition with photovoltaic properties, comprising a step of blending, in a solvent encouraging the production of nanofibrils, at least one electron donor type semiconductor polymeric material essentially in the form of the nanofibrils and at least one electron acceptor type material in the solvent, said nanofibrils representing 50% to 93% by weight of the electron donor type semiconductor polymeric material.

2. A method according to claim 1, wherein the blend obtained at the end of the blending step is deposited onto a substrate directly without having recourse to annealing.

3. A method according to claim 1, wherein the nanofibrils are prepared, before the blending step, during a step of dissolving at least one electron donor type semiconductor polymeric material in an organic solvent encouraging the production of nanofibrils.

4. A method according to claim 3, wherein the dissolution step is carried out by dissolution at a temperature which is higher than ambient temperature followed by slow cooling to ambient temperature.

5. A method according to claim 3, wherein the nanofibrils are separated from the unassociated electron donor type polymeric material by centrifuging and/or filtration.

6. A method according to claim 1, wherein the organic solvent is p-xylene.

7. A method according to claim 1, wherein the organic solvent is selected from cyclohexanone, chlorobenzene, dichlorobenzene, and a mixture thereof.

8. A method according to claim 1, wherein the blending step is carried out with stirring.

9. A method according to claim 1, wherein the electron donor type semiconductor polymeric material is selected from polythiophenes, polythienylenevinylenes, polyphenylenes, polyphenylenevinylenes, polyanilines, polyfluorenes, and a mixture thereof.

10. A method according to claim 9, wherein the electron donor type semiconductor polymeric material is selected from poly(3-hexylthiophene), poly(3-hexyloxythiophene), (poly(2-methoxy-5-(2'-ethylhexyloxy)$_p$-phenylenevinylene) and poly(2-methoxy-5-(3',7'-dimethyloctyloxy)-1,4-phenylenevinylene), their derivatives, and a mixture thereof.

11. A method according to claim 1, wherein the electron acceptor type material comprises inorganic acceptor type semiconductor nanocrystals which may optionally be coated with an organic layer, semiconductor nanofibers, organic acceptors, or a mixture thereof.

12. A method according to claim 11, wherein the inorganic acceptor type semiconductor nanocrystals are coated with an organic layer comprising polythiophenes, oligothiophenes, or a mixture thereof.

13. A method according to claim 11, wherein the semiconductor nanofibers are selected from Si, AsGa, Ge, InP, CdSe, and CdTe, and a mixture thereof.

14. A method according to claim 11, wherein the organic acceptor type materials are selected from C60 fullerene derivatives, C61 fullerene derivatives, C70 fullerene derivatives, carbon nanotubes and their derivatives, perylene and its derivatives, quinoxalines, and tetracyanoquinodimethane, and a mixture thereof.

15. A method according to claim 14, wherein the organic electron acceptor type material is 1-(3-methoxycarbonyl)-propyl-1-phenyl-[6,6]-C61.

16. A polymeric composition obtained by the method according to claim 1.

17. A polymeric composition with photovoltaic properties according to claim 16, wherein the electron donor type semiconductor polymeric material is poly-(3-hexylthiophene) and the electron acceptor type material is 1-(3-methoxycarbonyl)-propyl-1-phenyl-[6,6]-C61.

18. A polymeric composition with photovoltaic properties according to claim 16 including 0.5% to 2% by weight of electron donor type semiconductor polymeric material.

19. A method of depositing a material comprising the composition according to claim 16, in the form of a thin layer, wherein the material is deposited onto a solid substrate by immersion, using inkjet, spin-coating, spray drying, spreading, or printing techniques.

20. A deposition method according to claim 19, wherein the material is deposited onto the solid substrate as a monolayer.

21. A deposition method according to claim 19, wherein the material is deposited onto the solid substrate as a multilayer.

22. A method according claim 19, wherein the solid substrate is selected from glasses, conductive polymers, polymers coated with a conductive oxide and glasses coated with a conductive layer.

23. A method according to claim 22, wherein the conductive polymers are polyethylenedioxythiophene, polyaniline, or a mixture thereof.

24. A photovoltaic cell, comprising a thin layer obtained by carrying out a method according to claim 19.

25. A bulk heterojunction-type photovoltaic cell, comprising at least two electrodes which are electrically connected by the composition according to claim 16.

26. A bulk heterojunction-type photovoltaic cell, comprising at least two electrodes which are electrically connected by the thin layer obtained by carrying out the method according to claim 19.

27. A photovoltaic cell according to claim 25, wherein the composition is selected such that the power conversion efficiency of the cell is 3% or more.

28. A photovoltaic cell according to claim 26, wherein the composition is selected such that the power conversion efficiency of the cell is 3% or more.

* * * * *